United States Patent

Matsuda et al.

[11] Patent Number: 5,607,877
[45] Date of Patent: Mar. 4, 1997

[54] PROJECTION-ELECTRODE FABRICATION METHOD

[75] Inventors: Tatsuharu Matsuda; Masaharu Minamizawa, both of Kawasaki, Japan

[73] Assignee: Fujitsu Limited, Kawasaki, Japan

[21] Appl. No.: 321,013

[22] Filed: Oct. 6, 1994

[30] Foreign Application Priority Data

Dec. 28, 1993 [JP] Japan .................................. 5-337221

[51] Int. Cl.$^6$ ................................................ H01L 21/283
[52] U.S. Cl. ........................ 437/180; 437/183; 437/787; 437/915
[58] Field of Search .................................. 437/183, 789, 437/787, 50, 180, 203, 915; 257/737, 738, 773

[56] References Cited

U.S. PATENT DOCUMENTS 4,272,880  6/1981  Pashley .
4,612,083  9/1986  Yasumoto et al. ...................... 156/633
4,646,424  3/1987  Parks et al. ............................. 156/643
5,306,648  4/1994  Fukaya et al. ............................. 437/3
5,376,231  12/1994  Matsumoto et al. ..................... 156/656
5,521,118  5/1996  Lam et al. ................................ 437/180

*Primary Examiner*—T. N. Quach
*Attorney, Agent, or Firm*—Armstrong, Westerman, Hattori, McLeland, & Naughton

[57]  ABSTRACT

A projection-electrode fabrication method having the steps of: (a) fabricating at least one projection electrode directly on a substrate; and (b) forming a semiconductor circuit layer adjacent to the projection electrode on the substrate so as to contact at least one projection electrode after the step of fabricating the projection electrode. The projection electrode is projected higher as compared to the semiconductor circuit layer.

3 Claims, 6 Drawing Sheets

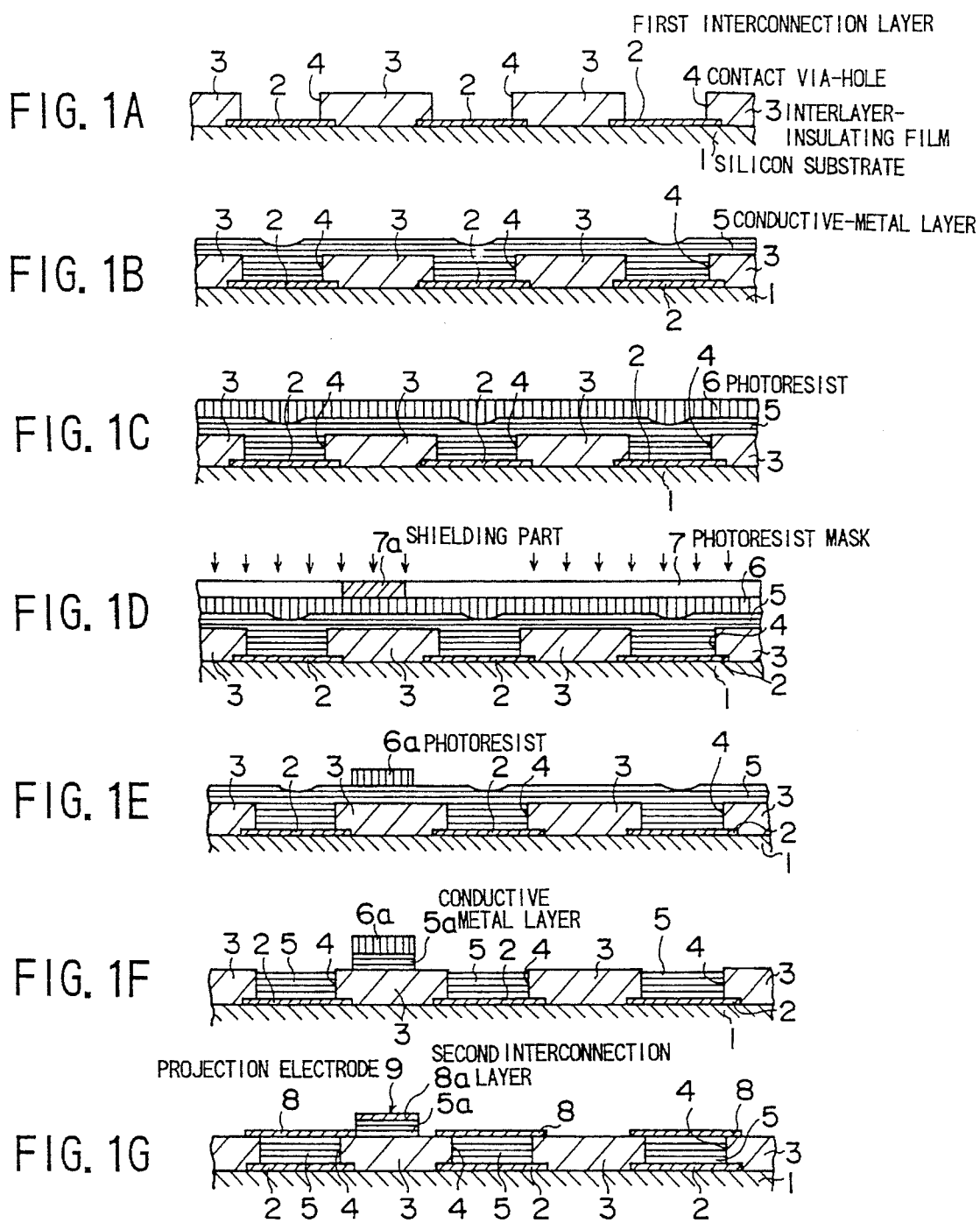

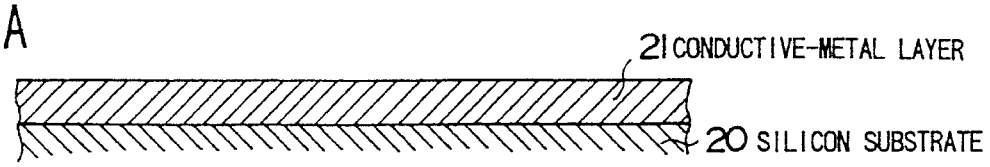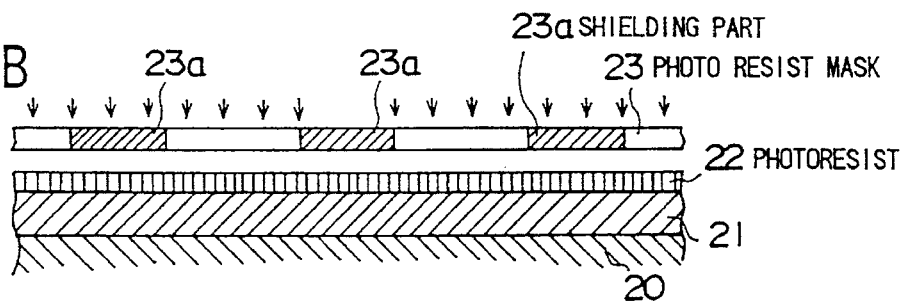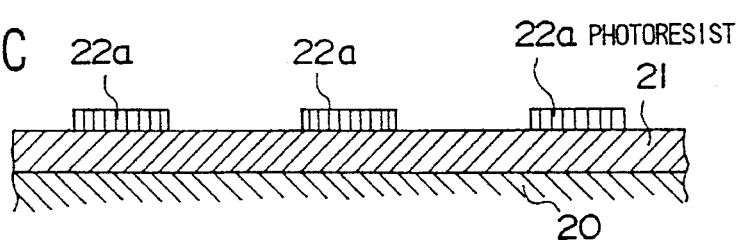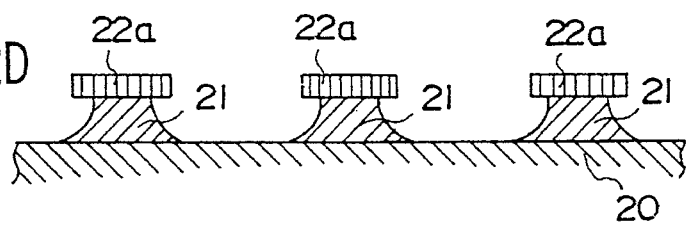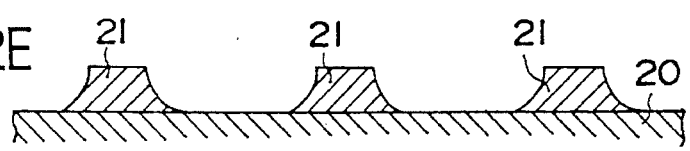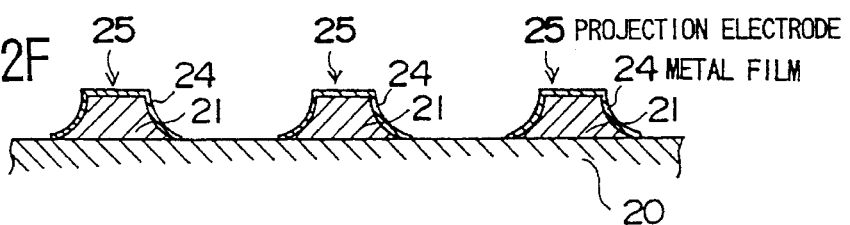

PROJECTION-ELECTRODE FABRICATION METHOD

BACKGROUND OF THE INVENTION

1. Field of the Invention

The present invention generally relates to a projection-electrode fabrication method and a semiconductor device including a projection electrode, and more particularly, to a fabrication method of the projection electrode which is utilized for a flipchip-mounting method or a tape-automated bonding (TAB) method.

Recently, to meet demands for miniaturization, high speed, and high-density mounting in a computer, establishment of a fabrication technology for a semiconductor device, having features of a fine pitch and a multipin, is required, and a semiconductor device providing low cost as well as meeting the above demands, is further desired.

As methods capable of mounting a multipin semiconductor device with low cost, the flipchip-mounting method and the TAB method are well known. In the flipchip-mounting method and the TAB method, projection electrodes such as bumps are formed on the semiconductor device, and via these projection electrodes the semiconductor device is connected with a mounting substrate or a TAB tape.

Therefore, to mount the multipin semiconductor device at low cost, the projection electrodes need to be fabricated with high efficiency and at low cost.

2. Description of the Prior Art

In a conventional projection-electrode fabrication method which is used for the flipchip-mounting method and the TAB method, first a circuit is formed in the semiconductor device, and next projection electrodes are fabricated on electrode pads which have been formed in that semiconductor device. In further detail, on the electrode pads which have been formed in the semiconductor device, the projection electrodes are fabricated by means of an evaporation method by an electrolysis plating method and a sputtering system, etc., being implemented for lithographic technologies.

It is noted that in a conventional fabrication method of the projection electrode, after a series of the semiconductor-device fabrication process for fabricating the semiconductor device is completed, a projection-electrode fabrication process is independently carried out to form the projection electrodes.

Therefore, in the conventional fabrication method of the projection electrode, the projection electrodes are fabricated by using the lithographic technology after the forming of the circuit in the semiconductor device, consequently such a process as using a lithographic technology is implemented twice for forming the circuit in the semiconductor device and for fabricating the projection electrodes on the circuit. Thus, from a standpoint of total fabrication procedures of the semiconductor device, a large number of procedures, much equipment and a long processing time are required, so that it may cause the device cost to increase.

SUMMARY OF THE INVENTION

It is an object of this invention to provide a projection-electrode fabrication method by which a projection electrode for external routing of a semiconductor device can be fabricated in a short time and at low cost, in which the disadvantages described above are eliminated.

The object described above is achieved by a projection-electrode fabrication method comprising the step of fabricating a projection electrode at the same time of forming a conductive layer of a semiconductor device.

The object described above is also achieved by a projection-electrode fabrication method comprising the steps of forming an interlayer-insulating member on a substrate, having a contact via-hole at a given location, forming a conductive layer within the contact via-hole and over the interlayer-insulating member, and processing the conductive layer so that a projection-electrode layer for fabricating a projection electrode is formed at the same time as an interlayer-conductive layer within the contact via-hole is formed.

The object described above is further achieved by a projection-electrode fabrication method comprising the step of layering a plurality of projection-electrode layers by repeating the steps of the interlayer-insulating member, forming the conductive layer, and processing the conductive layer in order, so that the projection electrode including the plurality of projection electrode layers is fabricated.

The object described above is achieved by the projection-electrode fabrication method, wherein the step of the processing the conductive layer comprises the step of processing the conductive layer with a lithographic technology.

The object described above is achieved by a projection-electrode fabrication method comprising the steps of fabricating a projection electrode on a substrate on which at least a conductive layer is formed, and forming a semiconductor circuit and the conductive layer on the substrate after fabricating the projection electrode.

The object described above is achieved by a projection-electrode fabrication method wherein the step of the fabricating a projection electrode further comprises the steps of forming a projection-electrode layer on the substrate, and fabricating the projection electrode by etching the projection-electrode layer except a part of a location for fabrication of the projection electrode by means of a lithographic technology.

In addition, the object described above is achieved by a projection-electrode fabrication method, wherein the step of the fabricating the projection electrode by etching comprises the step of etching the projection-electrode layer with a wet-etching method.

According to the projection-electrode fabrication method, the projection electrode is fabricated in the forming process of the conductive layer on the substrate, so that the projection-electrode fabrication process and the semiconductor-device forming process can be simultaneously carried out in one common process. As a result, simplification of the procedures and device-cost reduction may be realized.

And according to the projection-electrode fabrication method, in the projection-electrode-layer forming process, by using a lithographic technology for processing the conductive layer, an accurate projection electrode can be easily fabricated, and the conductive-layer forming process and the projection-electrode-layer process may be easily carried out in a common process.

And according to the projection-electrode fabrication method, the projection electrode is fabricated before the semiconductor circuit and the conductive layer are formed on the substrate, and the projection-electrode fabrication is selectable regardless of the fabrication process of components of the semiconductor device, so that a simple fabrication method may be selected, and device-cost reduction can be realized.

Further according to the projection-electrode fabrication process, the projection-electrode layer is formed on the substrate, subsequently the projection-electrode layer is etched, more specifically is wet-etched except a part of a location for fabrication of the projection electrode by means of the lithographic technology, and thus the projection electrode is easily fabricated.

Other objects and further features of the present invention will be apparent from the following detailed description when read in conjunction with the accompanying drawings.

BRIEF DESCRIPTION OF THE DRAWINGS

FIG. 1A to FIG. 1G are a series of illustrations for explaining a first embodiment according to the present invention;

FIG. 2A to FIG. 2F are a series of illustrations for explaining a second embodiment according to the present invention;

DESCRIPTION OF THE PREFERRED EMBODIMENTS

Figure 3:
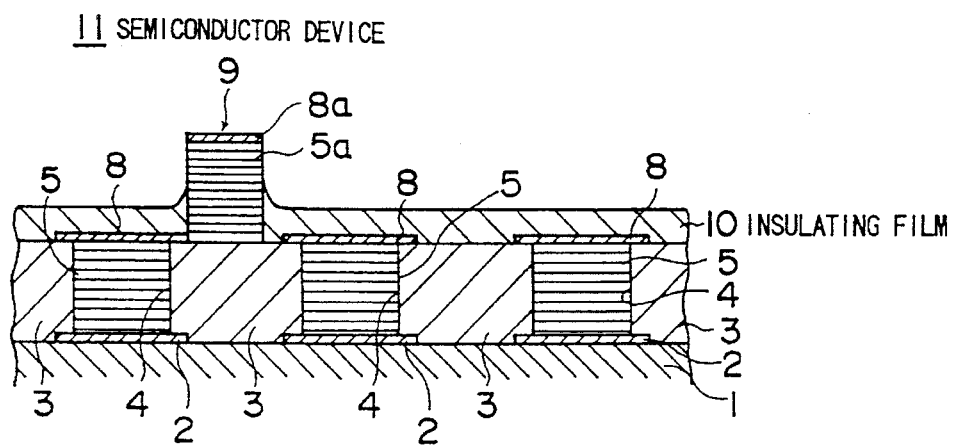
FIG. 3 is an expanded illustration of a projection electrode fabricated in the first embodiment according to the present invention.

First, a description will be given of first embodiment according to the present invention by referring to FIG. 1A to FIG. 1G. FIG. 1A to FIG. 1G show the fabrication method of a projection electrode. To fabricate the projection electrode according to the first embodiment, a first interconnection layer 2 consisting of conductive metal such as aluminum (A1) is layered at a given location over a silicon (Si) substrate 1 as a base for a semiconductor device. Subsequently, an interlayer-insulating film 3 is formed over the silicon substrate 1 where the first interconnection layer is formed. For the interlayer-insulating film 3, a material such as a glass of insulated silicon family is applied. Next, a part of the interlayer-insulating film 3, corresponding to the first interconnection layer 2, is removed by such as a lithographic technology, and consequently a contact via-hole 4 is constructed. FIG. 1A shows a condition after the above process has been carried out.

A conductive-metal layer 5 consisting of such as tungsten (W) is then formed over the silicon substrate 1 where the first interconnection layer 2, the interlayer-insulating film 3 and the contact via-hole 4 have been constructed, by a chemical vapor deposition (CVD) method, etc. A thickness of the conductive-metal layer 5 is, for instance 5 µm to 30 µm, therefore the contact via-hole 4 is filled with this conductive-metal layer 5, and also the conductive-metal layer 5 is formed over the interlayer-insulating film 3. Thus, the first interconnection layer 2 is electrically connected to the conductive-metal layer 5, so that the conductive-metal layer 5 filling the contact via-hole 4 is operative as a routing for interlayer connection of a semiconductor circuit. FIG. 1B shows a condition after the conductive-metal layer 5 has been formed.

Once the conductive-metal layer is formed, as shown in FIG. 1C, a photoresist 6 as a sensitizer is spread over the conductive-metal layer 5. After the spread of the photoresist 6, as shown in FIG. 1D, a photoresist mask 7 is disposed on the photoresist 6. A shielding part 7a is formed in the photoresist mask 7, whereby the location of the shielding part 7a is selected to be at the same location of the projection-electrode fabrication. Subsequently, a shape of the shielding part 7a is transcribed to the photoresist 6 by lighting over the photoresist mask 7.

Furthermore, when the photoresist 6 sensitized by exposure is developed, as shown FIG. 1E, only a photoresist 6a corresponding to the location of the shielding part 7a remains. In this condition, the conductive-metal layer 5 located on the interlayer-insulating film 3 is removed by etching the conductive-metal layer. At this time, the photoresist 6a is disposed at the location for fabricating the projection electrode, so that as shown in FIG. 1F the conductive-metal layer 5a remains at the location for fabricating the projection electrode because of not being etched.

In the other part except the location for fabricating the projection electrode, an etching of the conductive-metal layer 5 is controlled so that a top plate of the conductive-metal layer 5 within the contact via-hole 4 and a top plate of the interlayer-insulating film 3 could be approximately one plate.

Next, the photoresist 6a formed at the location for fabricating the projection electrode is removed, as shown in FIG. 1G, and a second interconnection layer 8 consisting of such as aluminum is formed over the conducive-metal layer 5 which is disposed in the contact via-hole 4, and in addition, a second interconnection layer 8a is also formed over the conductive-metal layer 5a formed at the location for fabrication the projection electrode. Consequently, a projection electrode 9 is fabricated by construction of the conductive-metal layer 5a and the second interconnection layer 8. The first interconnection layer 2 and the second interconnection layer 8 are electrically connected via the conductive-metal layer 5 which is operative as interlayer connection between layers.

On the other hand, in the forming of the second interconnection layer 8, the projection electrode 9 and the second interconnection layer 8 are electrically connected at a given location. In the example shown in FIG. 1G, the second interconnection layer 8 formed in the left end is electrically connected with the bottom left of the projection electrode 9. This electrical connection between the projection electrode 9 and the second interconnection layer 8 is easily achieved by properly adjusting the shape of the mask for forming the second interconnection layer 8 during processing the second interconnection layer 8 with the lithographic technology.

After the projection electrode 9 is fabricated, as shown in FIG. 3, an insulating film 10 is formed over the second interconnection layer 8 and the interlayer-insulating film 3, and as a result, a semiconductor device 11 is fabricated. In this description, a description with illustrations for fabrication procedures of the semiconductor circuit are omitted because this present invention features are in the fabrication method of the projection electrode.

The method described above clearly shows that both the conductive-metal layer 5a and the second interconnection layer 8a constructing the projection electrode 9 are identical with the second interconnection layer 8 and the conductive-metal layer 5 constructing the semiconductor device, and are formed in the same process. Therefore, the projection electrode 9 is fabricated without removing the conductive-metal layer 5 at the location for fabricating the projection electrode in the removing process of the conductive-metal layer 5 as shown in FIG. 1C to FIG. 1F.

As described above, according to this embodiment, the projection electrode can be fabricated by the same process as that of forming the second interconnection layer 8 and the conductive-metal layer 5 constructing the semiconductor device 11. Therefore, the fabrication process of the projection electrode 9 and the forming process of the semiconductor circuit can be operative in a common process, so that simplification of the procedures and reduction of the device cost may be realized. And the fabrication of the second interconnection layer 8 and the conductive-metal layer 5 are carried out by the lithographic technology, thus this fabricating method also has a feature that the fabrication process of the projection electrode 9 and the semiconductor device 11 are easily carried out in the common process.

Figure 5:
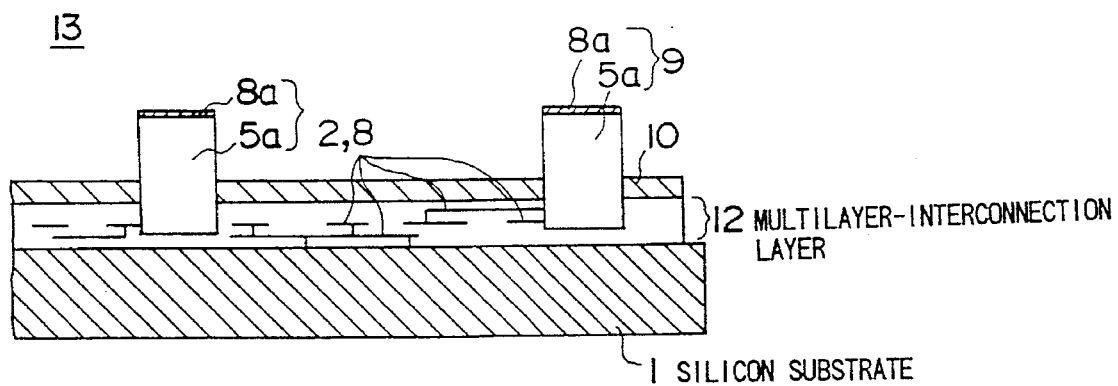
FIG. 5 is a cross-sectional view of a semiconductor device having the projection electrode fabricated in the first embodiment according to the present invention.

In the fabrication method of the projection electrode 9 described referring to FIG. 1 and FIG. 3, a case that the conductive-metal layer 5 is one layer, and the semiconductor device 11 is constructed by sandwiching the conductive-metal layer 5 with the interconnection layers 2, 8, is shown as one example. However, it will be apparent to those skilled in the art that the present invention may be suitably applied to a semiconductor device 13 having a multilayer-interconnection layer 12 which is constructed by layering a plurality of conductive-metal layers and interconnection layers as shown in FIG. 5.

The description mentioned above clearly shows that a height of the projection electrode 9 is related with a thickness of the conductive-metal layer 5, and in the case of using the multilayer-interconnection layer 12 the height of the projection electrode 9 can be adjustable by selectively layering a given number of the conductive-metal layers.

Next, a description will be given of a second embodiment of the fabrication method of the projection electrode according to the present invention, by referring to FIG. 2A to FIG. 2F.

For fabricating the projection electrode according to the second embodiment, as shown in FIG. 2A, a conductive-metal layer 21 such as aluminum, which is robust against high temperature (for example melting point is over 450° C. to 500° C.) during fabrication of the semiconductor circuit, is formed with a uniform thickness of, for example about 5 μm to 50 μm. A thickness of the conductive-metal layer 21 formed over a silicon substrate 20 is the same height as that of the projection electrode which will be fabricated in the following procedures. Therefore, in a process shown in FIG. 2A, by adjusting the thickness of the conductive-metal layer 21, a height size of the projection electrode to be fabricated is controllable.

After the conductive-metal layer 21 is fabricated over the silicon substrate 20, as shown in FIG. 2B, a photoresist 22 as a sensitizer is spread over the conductive-metal layer 21, and a photoresist mask 23 is disposed a given space apart on the photoresist 22. A shielding part 23a is formed in the photoresist mask 23, and a location for forming the shielding part 23a is selected to coincide with a location for fabricating the projection electrode. A shape of the shielding part 23a is then transcribed to the photoresist 22 by lighting over the photoresist mask 23.

Once a needless part of the photoresist is removed by developing the photoresist which has been sensitized by exposure, as shown in FIG. 2C, only a photoresist 22a at the location of the shielding part 23a remains. In this situation, an etching process for the conductive-metal layer 21 is carried out.

In this embodiment, a wet-etching method is used as a method for etching the conductive-metal layer 21, and in the case of the conductive-metal layer 21 of aluminum, an etching medium such as $H_3PO_4$-$CH_3COOH$-$NH_3$ is suitable. By etching the conductive-metal layer 21 with the wet-etching method, the conductive-metal layer 21 is etched by permeation of the etching medium from around the photoresist 22a (over etching), so that as shown in FIG. 2D a shape of the conductive-metal layer 21 after the etching is suitable for a shape of the projection electrode.

Thus, by etching the conductive-metal layer 21 with the wet-etching method, the shape of the conductive-metal layer 21 is formed to the shape for the projection electrode without a special shaping process. And by carrying out the above etching process, the other part except the location for fabricating the projection electrode, exposes the silicon substrate 21.

Subsequently, as shown in FIG. 2E, the photoresist 22a remaining over the conductive-metal layer 21 is removed. As shown in FIG. 2F, a metal film 24 (for example gold (Au)) is formed over the conductive-metal layer 21 which is formed at the location for fabricating the projection electrode so as to achieve good connection with a mounting substrate, as a result, a projection electrode 25 is fabricated.

Figure 4:
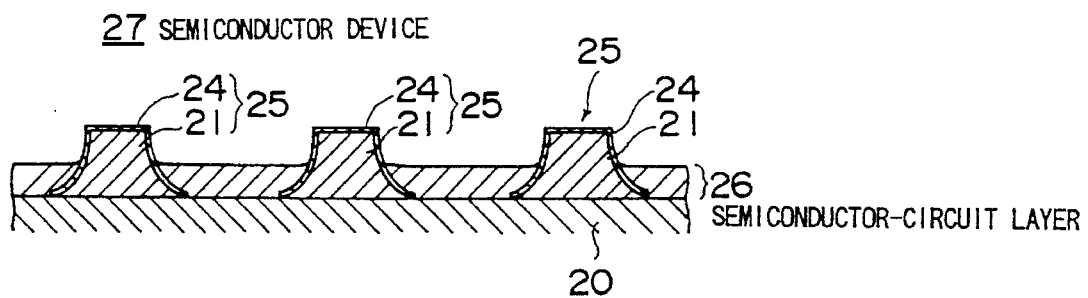
FIG. 4 is a cross-sectional view of a semiconductor device having a projection electrode fabricated in the second embodiment according to the present invention.
Figure 6:
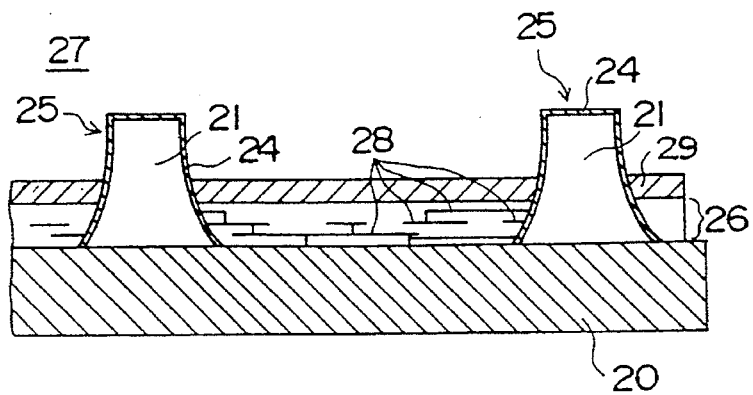
FIG. 6 is a cross-sectional view of the semiconductor device having the projection electrode fabricated in the second embodiment according to the present invention.

After a series of the fabrication process of the projection electrode 25 is completed, a fabrication process of a semiconductor device is carried out on the silicon substrate 20 on which the projection electrode 25 is fabricated. In this process, as shown in FIG. 4, a semiconductor-circuit layer 26 is formed and a semiconductor device 27 is fabricated. During the forming of the semiconductor-circuit layer 26, the projection electrode 25 is already fabricated on the silicon substrate 20, so that as shown in FIG. 6 an interconnection layer 28, which is formed in the semiconductor-circuit layer having a general layer structure, can be directly connected with the projection electrode 25. Therefore, a connection process between the interconnection layer 28 and the projection electrode 25 is simply performed, and the above improves a flexibility of interconnection in the interconnection layer 28. In FIG. 6, a layer labeled "29" indicates a insulating layer for protecting the semiconductor-circuit layer 26.

In the fabrication method of the projection electrode according to the second embodiment, the projection electrode 25 is fabricated before forming the semiconductor-circuit layer 26 on the silicon substrate 20, thus the fabrication method of the projection electrode 25 is selectable nevertheless the forming method of the semiconductor-circuit layer 26. Therefore, a simple fabrication method can be selected as a fabrication method of the projection electrode 25, and reduction of the device cost may be achieved. Particularly, in this embodiment, a use of the wet-etching method enables an automatic shaping of the projection electrode 25 for a suitable shape (a mountain-like shape), and also the wet-etching method enables the reduction of the fabrication cost because of simplicity of the wet-etching method rather than another fine processing method (for example a fine processing method using an exposure technology, etc.).

In the wet-etching method, the silicon substrate 20 is dipped into the etching medium, therefore, its method is not suitable for a case that any member which is easily eroded by the etching medium is existing in the silicon substrate 20. However, in this embodiment, the projection electrode 25 is fabricated before forming of the semiconductor-circuit layer 26, therefore such a above problem does not exist and it is not inconvenient to use the wet-etching method.

Next, a description will be given of a mounting method of semiconductor devices 11, 13, and 27 on a mounting substrate 30 by using the projection electrodes 9, 25 fabricated in each of the above embodiments by referring to FIG. 7 and FIG. 10. In the following description, an example in which the semiconductor device 27 in which the projection electrode 25 is fabricated is mounted on the mounting substrate 30 is described. Descriptions about mounting constructions of the semiconductor devices 11, 13 are omitted because the mounting constructions of the semiconductor devices 11, 13 are the same as that of the semiconductor device 27.

Figure 7:
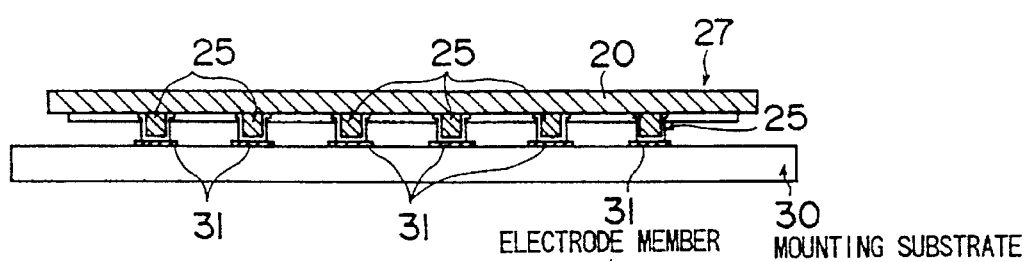
FIG. 7 is an illustration for explaining a method of mounting the semiconductor device, having a projection electrode fabricated by the method according to the present invention, on a mounting substrate.

FIG. 7 shows an example in which the projection electrode 25, fabricated by the fabrication method according to the present invention, is applied face down to a flipchip mounting. In this flipchip mounting, the projection electrode 25 and an electrode member 31 are connected by contacting a plurality of the projection electrodes 25 fabricated on the semiconductor device 27 with the electrode member 31 fabricated on the mounting substrate 30.

Figure 8:
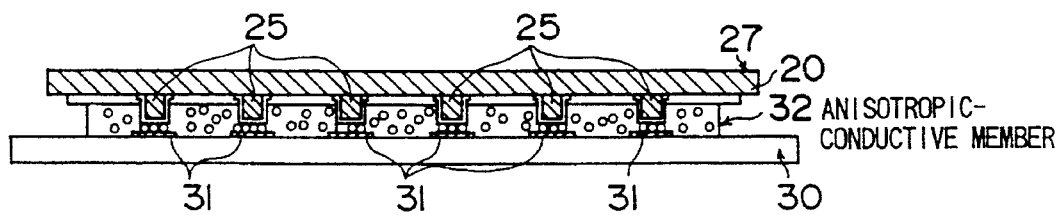
FIG. 8 is an illustration for explaining a method of mounting the semiconductor device, having the projection electrode fabricated by the method according to the present invention, on the mounting substrate.

In FIG. 8, an anisotropic-conductive member 32 is disposed between the semiconductor device 27 in which a plurality of the projection electrodes 25 are fabricated and the mounting substrate 30 on which a plurality of the electrode members 31 are fabricated, and each projection electrode 25 and each electrode member 31 are electrically connected via the anisotropic-conductive member 32. The anisotropic-conductive member 32 is constructed by mixing silver (Ag) particles into an epoxy resin as a filler. In a contact area between the projection electrode 25 and the electrode member 31, the silver particles are maintained between the projection electrode 25 and the electrode member 31, so that the contact area between them becomes conductive. However, in other areas except the contact area, because each of the silver particles is isolated by the epoxy resin as an insulated resin, the areas transverse the illustration is unconductive. Therefore, the contact area between the projection electrode 25 and the electrode member 31 is conductive, while the areas between neighboring projection electrodes are unconductive. Further, a bonding function of the epoxy resin enables strong bonding between the semiconductor device 27 and the mounting substrate 30.

Figure 9:
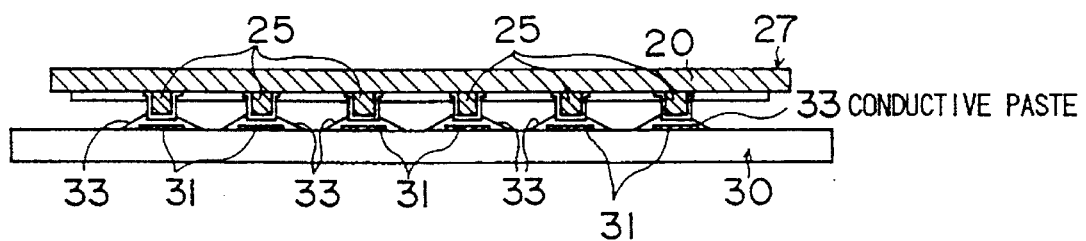
FIG. 9 is an illustration for explaining a method of mounting the semiconductor device, having the projection electrode fabricated by the method according to the present invention, on the mounting substrate.

A feature of FIG. 9 is that a conductive paste 33 is disposed in the contact area between the projection electrode 25 and the electrode member 31. The conductive paste 33 is operative as a member for a good electrical connection between the projection electrode 25 and the electrode member 31, and as a bonding medium for bonding between the projection electrode 25 and the electrode member 31, so that sure electrical connection and strong mechanical bonding between the semiconductor device 27 and the mounting substrate 30 can be achieved. It is possible to use solder, etc., instead of the conductive paste 33.

Figure 10:
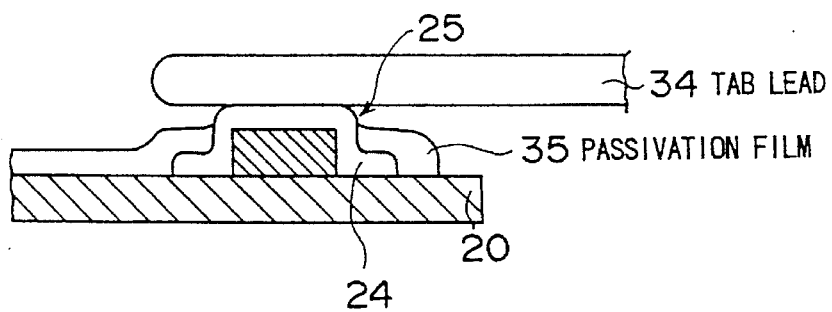
FIG. 10 is an illustration for explaining a method of mounting the semiconductor device, having the projection electrode fabricated by the method according to the present invention, on the mounting substrate.

Furthermore, FIG. 10 shows an example that the projection electrode 25 is applied to a TAB mounting method. In FIG. 10, label "34" indicates a TAB lead which is constructed by plating tin (Sn), etc., on a face of a base consisting of copper (Cu). By pressing the heated TAB lead 34 on the projection electrode 25 with a pressing tool (not shown), and by coupling the metal film 24 of gold (Au) formed on the face of the projection electrode 25, with tin formed on the face of the TAB lead 34, the projection electrode 25 is constructed to be connected with the TAB lead 34. In FIG. 10, label "35" indicates a passivation film for protecting the projection electrode 25.

As described above, the projection electrode 9, 25 fabricated according to the present invention is suitably applied to a variety of mounting constructions.

As described above, these present inventions have the following features.

According to the projection-electrode fabrication method, the projection electrode is fabricated in the forming process of the conductive layer on the substrate, so that the projection-electrode fabrication process and the semiconductor-device forming process can be simultaneously carried out in one common process. As a result, simplification of the procedures and device-cost reduction may be realized.

And according to the projection-electrode fabrication method, in the projection-electrode-layer forming process, by using a lithographic technology for processing the conductive layer, an accurate projection electrode can be easily fabricated, and the conductive-layer forming process and the projection-electrode-layer process may be easily carried out in a common process.

And according to the projection-electrode fabrication method, the projection electrode can also be fabricated before the semiconductor circuit and the conductive layer are formed on the substrate, and the projection-electrode fabrication is selectable regardless of the fabrication process of components of the semiconductor device, so that a simple fabrication method may be selected, and device-cost reduction can be realized.

Further, according to the projection-electrode fabrication process, the projection-electrode layer is formed on the substrate, subsequently the projection-electrode layer is etched, specifically is wet-etched except a part of a location for fabrication of the projection electrode by means of the lithographic technology, thus the projection electrode is easily fabricated.

Further, the present invention is not limited to these embodiments, but various variations and modifications may be made without departing from the scope of the present invention.

What is claimed is:

1. A projection-electrode fabrication method, comprising the steps of:

(a) fabricating at least one projection electrode directly on a substrate; and (b) forming a semiconductor circuit layer adjacent to said projection electrode on the substrate so as to contact at least one projection electrode after said step of fabricating the projection electrode, wherein said projection electrode is projected higher as compared to said semiconductor circuit layer.

2. The projection-electrode fabrication method as claimed in claim 1, wherein said step (a) further comprises the steps of:

(a-1) forming a projection-electrode layer on said substrate; and (a-2) fabricating said projection electrode by etching said projection-electrode layer except a part of a location for fabrication of the projection electrode by means of a lithographic technology.

3. The projection-electrode fabrication method as claimed in claim 2, wherein said step (a-2) comprises the step of etching said projection-electrode layer with a wet-etching method.

* * * * *